United States Patent [19]

Ju et al.

[11] Patent Number: 5,831,674
[45] Date of Patent: Nov. 3, 1998

[54] OBLIQUE ACCESS TO IMAGE DATA FOR READING BAR CODES

[75] Inventors: Paul P. Ju; Ynjiun P. Wang, both of Fort Myers, Fla.

[73] Assignee: Metanetics Corporation, Fort Myers, Fla.

[21] Appl. No.: 538,834

[22] Filed: Oct. 4, 1995

Related U.S. Application Data

[63] Continuation of Ser. No. 258,428, Jun. 10, 1994, abandoned.

[51] Int. Cl.$^6$ ................................................... H04N 5/335
[52] U.S. Cl. ........................................... 348/302; 348/303
[58] Field of Search ..................................... 348/294, 300, 348/301, 302, 303, 304, 308; 245/462

[56] References Cited

U.S. PATENT DOCUMENTS

| | | | |
|---|---|---|---|
| 5,155,343 | 10/1992 | Chandler et al. | 235/462 |
| 5,262,871 | 11/1993 | Wilder et al. | 348/307 |
| 5,276,400 | 1/1994 | Denyer et al. | 324/158 R |
| 5,304,787 | 4/1994 | Wang | 235/462 |
| 5,319,181 | 6/1994 | Shellhammer et al. | 235/462 |
| 5,345,266 | 9/1994 | Denyer | 348/300 |
| 5,396,054 | 3/1995 | Krichever et al. | 235/462 |

FOREIGN PATENT DOCUMENTS

| | | | |
|---|---|---|---|
| 0 260 954 | 3/1988 | European Pat. Off. | H04N 5/217 |
| 384955A | 9/1990 | European Pat. Off. | G06K 7/10 |
| 3-271987 | 12/1991 | Japan | G06K 7/10 |
| 2044 996 | 10/1980 | United Kingdom | H01L 27/14 |
| WO 91/04633 | 4/1991 | WIPO | H04N 3/15 |

*Primary Examiner*—Wendy Garber
*Assistant Examiner*—Tuan V. Ho
*Attorney, Agent, or Firm*—Kenneth P. Robinson

[57] ABSTRACT

An image sensor array system is addressable to enable readout of randomly selected image data from any one or more individual sensor cells, for any selected image area (13), or for the entire image area (15). The sensor array (16) is accessed by horizontal and vertical readout circuits (22 and 24) under the control of address signals from an address unit (20). Location signals, from a source (12), indicative of a selected image area (13) may be used by the address unit (20) to provide address signals representative of the location of a specific sensor cell or area (13) of the array including image data of interest. Under the control of the address signals, image data from cells at the intersection of array lines and columns are sampled by sampling devices (26–32) and provided as output signals representative of the selected portion of the image area at an output port (34). Simplified readout can be provided for oblique line components of images. Differing input bus widths enable different levels of cell or line selection.

16 Claims, 2 Drawing Sheets

OBLIQUE ACCESS TO IMAGE DATA FOR READING BAR CODES

This Preliminary Amendment accompanies the filing of a File Wrapper Continuation (FWC) application based upon application Ser. No. 08/258,428 filed Jun. 10, 1994, now abandoned.

This invention relates to image sensor array systems and, more specifically, to systems enabling access to selected portions of image data sensed by an image sensor array.

BACKGROUND OF THE INVENTION

Images are commonly sensed in two-dimensional arrays of sensor cells utilizing photodiodes. In order to access image data (developed by conversion of incident radiation to charge or potential temporarily stored in individual sensor cells, for example) the entire array of sensors is typically scanned on a sequential line-by-line basis under the control of shift registers or other control circuitry.

While such arrangements may be suitable for sensing and reading out entire images, they are less efficient in accessing only a selected portion of an image. A disadvantage in speed of operation results from the need to read out an entire 1 to N lines of image data in order to provide access to selected image data which may exist at the Nth line. Thus, for example, for an image sensed by a 128×128 sensor array, access to a selected portion of image data, such as line 120, a particular pixel in line 120, or lines 120–128, will require that image data at lines 1–119 first be read out and discarded. While the actual time required to read out such 119 lines of unwanted image data may be of short duration, the total wasted time may be significant in repetitive operation of a high-speed system. Alternatively, acceptable operating time may be achievable, but may necessitate the higher cost of very high speed circuits (e.g., high capability integrated circuits).

The automated reading of bar codes and matrix codes provides one example of an operative need for access to image data for only a portion of an image. An automated system may scan an image area which includes a two-dimensional bar code, for example. The location of the bar code within the image area can then be determined as described in U.S. Pat. No. 5,304,787, entitled "LOCATING 2-D BAR CODES", issued Apr. 19, 1994, the content of which is hereby incorporated by reference. With information as to the actual location of the bar code within the image area, it is then desirable to be able to access the limited area bar code image data without the necessity of reading out image data for the entire image area.

Prior image sensing systems operating with line-by-line sequential readout of image data can be provided in a variety of embodiments. For example, an integrated circuit approach is described in international application number WO91/04633, published under the Patent Cooperation Treaty on Apr. 4, 1992, entitled "I.C. Sensor". This publication illustrates an integrated arrangement of a sensor array and charge sampling devices enabling readout of image data for an entire image, but not randomly accessed portions of the image.

Objects of the present invention are, therefore, to provide new and improved image sensor array systems, and such systems which are addressable to enable access to one or more selected portions of image data sensed by an image sensor array.

Further objects are to provide sensor array systems enabling a selected portion of image data to be read out for further processing, while avoiding time and memory requirements otherwise necessary for full image readout.

SUMMARY OF THE INVENTION

In accordance with the invention, an addressable access image sensor array system, enabling access to image data for a selected portion of an image area, includes a two-dimensional array of image sensor cells arranged to provide image data representative of the entire image area, including the selected portion. An address unit is arranged to provide address signals representative of the location of the selected portion within the image area. The addressable system also includes one or more readout circuits, such as a horizontal readout circuit coupled to the array and responsive to address signals to selectively designate a row of cells and a vertical readout circuit also coupled to the array and responsive to address signals to selectively designate a column of cells, and at least one sampling device coupled to the array and arranged to access image data available at a cell at the intersection of such designated row and designated column. The system further includes an output device coupled to each such sampling device and arranged to provide output signals representative of the selected portion of the image area.

Also in accordance with the invention, an addressable access image sensor array system enabling access to image data for a selected image area portion including an oblique line component includes an address unit arranged to provide address signals representative of the location within the image area of an oblique line component positioned obliquely to the rows and columns of the image array sensor. Readout circuitry coupled to the array and responsive to the address signals is effective to selectively designate a series of cells at row and column intersections representative of the location of the oblique line component. This system also includes at least one sampling device coupled to the array and arranged to access image data available at cells in such series of cells and an output device coupled to each sampling device and arranged to provide output signals representative of the oblique line section rotated to an alignment not oblique to the rows and columns of the array.

For a better understanding of the invention, together with other and further objects, reference is made to the accompanying drawings and the scope of the invention will be pointed out in the accompanying claims.

DESCRIPTION OF THE INVENTION

Figure 1:
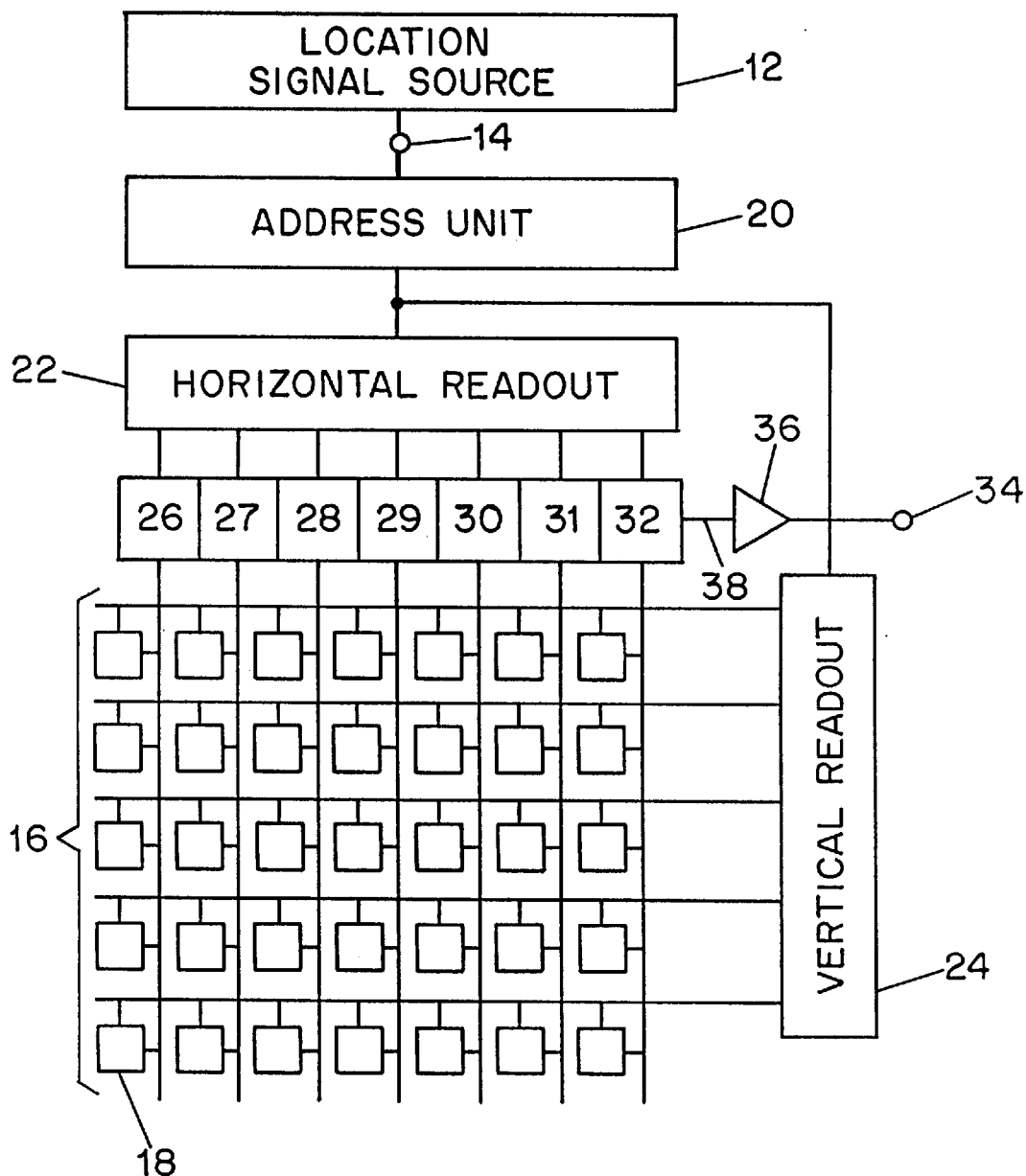
FIG. 1 illustrates a form of addressable access image sensor array system in accordance with the invention.
Figure 2:
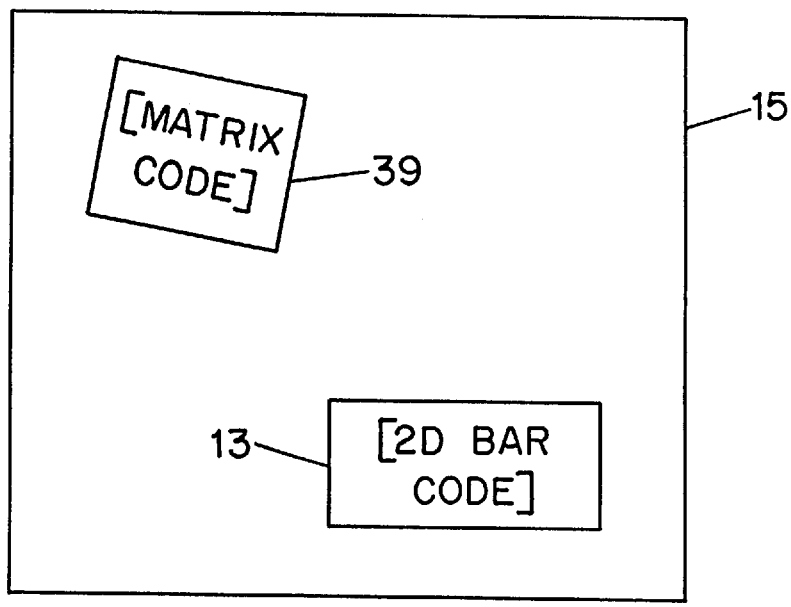
FIG. 2 is a representation of bar code and matrix code images within a larger image area, which is useful in describing operation of the FIG. 1 system.

An embodiment of an addressable access image sensor array system 10 in accordance with the invention is illustrated in FIG. 1. System 10 includes a coupling device, shown as location signal source 12, arranged to make available at coupling port 14 location signals representative of a selected portion of an image area. With reference to FIG. 2, in one example such location signals may represent the location of a two-dimensional bar code 13 within a larger image area 15. In different embodiments, the coupling device may be represented by location signal source 12 in the form of a system for bar code location, or merely by coupling port 14 as a device for making available signals provided from a source such as a bar code location system. The location signals can be provided in any appropriate form, e.g., signals representative of X and Y coordinates of the upper left corner and lower right corner of bar code 13 within area 15.

The FIG. 1 system also includes a two-dimensional array of image sensor cells, shown as array 16, arranged to sense image data representative of an image area, such as image area 15 including bar code image 13. Array 16 typically comprises a two-dimensional arrangement of individual photodiodes 18 which are electrically isolated and, when exposed to light or other radiation representative of a selected image, are effective to sense and make available image data in the form of varying levels of electronic charge or potential on a cell-by-cell (pixel-by-pixel) basis, or other suitable arrangement.

An address unit 20 is arranged to provide address signals representative of the location of the selected portion (e.g., bar code image 13) within the image area 15. In this embodiment, address unit 20 is coupled to input port 14 and is responsive to the location signals from unit 12, as shown. Thus, depending upon the particular form of the location signals (e.g., X and Y coordinates of corner locations), address unit 20 is configured to provide address signals for array cells which are expected to provide storage of image data representative of the bar code image, in this example. The particular configuration of unit 20 can be determined by skilled persons using available technology, in view of the particular form of the location information to be utilized, etc. In particular embodiments, it may be desirable to provide address signals covering a somewhat larger image area than specifically indicated by the location signals, so as to ensure that the entire bar code image area is included.

The FIG. 1 system further includes horizontal and vertical readout circuits 22 and 24, respectively, coupled to address unit 20 and responsive to the address signals. Horizontal readout circuit 22 is arranged to selectively designate a row of cells of array 16 (e.g., the row most closely corresponding to the left hand edge of bar code image 13). Vertical readout circuit 24 is arranged to selectively designate a column of cells of the array 16 (e.g., the column most closely corresponding to the upper edge of bar code image 13).

Also included is a plurality of sampling devices, shown as sample and hold amplifiers 26–32. The sampling devices 26–32 are each arranged to access, sample and temporarily hold image data (e.g., as represented by a sensor cell charge) existing at the cell at the intersection of a selected row and a selected column, as designated by the address signals from address unit 20. Thus, by designating a row of cells corresponding to the top edge of bar code image 13 and sequentially designating columns of cells, image data representative of the uppermost portion of bar code image 13 is accessed and read into the appropriate ones of sampling devices 26–32, in this example. Readout circuits 22 and 24 may be shift register type circuits arranged for sequential designation of one or more selected rows and columns using available techniques.

An output device, shown as output port 34, is arranged to provide output signals representative of the accessed image data (e.g., bar code image portion 13). As illustrated, the output circuit includes an amplifier 36 connected to a common readout line 38 which is arranged to receive image data signals from each of the sampling devices 26–32. The system is arranged so that as a selected row and a selected column are designated by readout circuits 22 and 24, the image data available in the cell at the intersection of such row and column is used as the basis for output signals provided at output port 34. In addition, after image data at one such cell is read out, any other cell in the array may be selected on a random or other predetermined basis to have its image data read out next. By repetition, image data for any desired area of the image area can be read out and stored for further processing without requiring the time and memory which would be needed if data for the entire image were read out.

Figure 3:
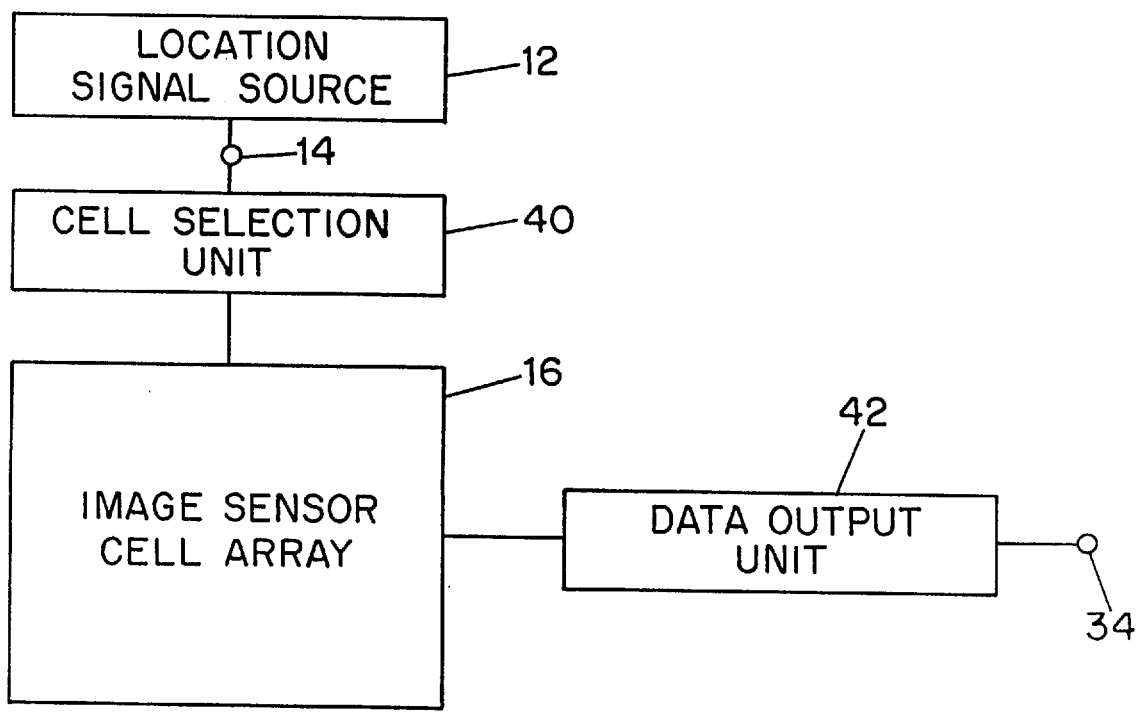
FIG. 3 illustrates a first alternative embodiment of the invention.

Referring now to FIG. 3, there is illustrated a more general implementation of an addressable access image sensor array system in accordance with the invention. In FIG. 3, location signal source 12 is connected, via coupling port 14, to cell selection unit 40 which is arranged for designating at least one cell within a selected portion of an image area for which image data is available from image sensor cell array 16, as described above. In the FIG. 1 system, address unit 20 in cooperation with horizontal and vertical readout circuits 22 and 24 are arranged to selectively designate rows and columns of cells in order to access selected cells. In the FIG. 3 system, cell selection unit 40 is included to provide a cell designation function and may be implemented as in FIG. 1 or in other appropriate manner by skilled persons once having an understanding of the invention. The system of FIG. 3 further includes data output unit 42 arranged for providing a signal representative of the image data provided by a portion of the selected cells of array 16. Unit 42 may be implemented by skilled persons in the form of devices such as 26–32, 36 and 38 as described, or in other appropriate form in order to provide operation in accordance with the invention. As shown, unit 42 may be arranged to provide the desired image data at output terminal 34 or in other suitable manner.

In operation of the systems of FIGS. 1 and 3 a variety of modes of image data readout can be carried out, depending upon the particular location signals provided at input port 14. Thus, randomly addressable access enables selection of a portion of image data as small as that represented by a single cell or pixel of the image, as discussed above. Single cells at different image area locations, or small two-dimensional image areas (e.g., 6 by 6 cell areas) at different locations, can be selected on an image sampling basis in order to survey image content, before initiating readout of image data for a selected image portion. Alternatively, utilizing location signals representative of the corners of a bar code image portion of interest, all image data representative of the bar code can be read out, while ignoring other portions of the overall image area which are not of current interest. Also, if desired, location signals can be provided in a form calling for readout of the image data for the entire image area on a sequential cell-by-cell, line-by-line basis, as in prior systems. This flexibility of operation provides both adaptability to varying objectives, and time efficient readout of image data for selected image portions. In addition to time savings, where data is read out and stored in memory for processing (e.g., bar code decoding) the required memory capacity can be significantly reduced by storage only of the image data for the image portion of interest, rather than requiring the storage of image data for the entire image as in prior systems.

It should be noted that in operation of systems in accordance with the invention, with particular reference to the FIG. 1 system for purposes of example, area selection is not limited to horizontally oriented rectangular areas as represented by bar code image 13 in FIG. 2, for example. The image area 15 illustrated in FIG. 2 also includes a matrix code image 39, shown tilted. With the provision of location signals representative of portion 39 of the image area 15 and the cell-by-cell addressable access capabilities of the invention, image data representative of the tilted square portion of the image area can be selected and read out by the system. Correspondingly, image portions such as circles, triangles, strips, irregular shapes, etc., can be selected (e.g., substantially any area), as well as lines and individual cells or pixels.

In particular implementations of the invention a trade-off between system complexity and performance may be appropriate. Thus, for example, with reference to FIG. 2, selecting only the portion of image area 15 actually occupied by bar code image 13, might represent time and memory savings of the order of 95 percent (i.e., if area 13 is equivalent to 5 percent of area 15). However, if the height of area 13 represents 20 percent of the height of area 15, 80 percent time and memory savings might be achievable by reading out each full row of the array which includes image data for the bar code, while not reading out the remaining rows. Accordingly, a system for carrying out this "full line" mode addressable operation, may include a horizontal readout circuit (24) responsive to the address signals to selectively designate a row of sensor cells and sampling devices (26–32) arranged to access data available at cells in the designated rows of cells. This full line approach can be implemented along either axis to read out either horizontal or vertical lines of image data, without providing the capability of selection along the other axis.

With reference to a tilted image such as 39, within larger image area 15, the addressable system can be configured to read out oblique lines as if they were horizontally or vertically oriented. Thus, a selected image portion 39, which includes an oblique line component (e.g., the upper edge), may be included in an image area 15 available in an array of sensor cells positioned in rows and columns. The address unit is arranged to provide address signals representative of the location within the image area 15 of the oblique line representing the top edge of selected portion 39. The readout circuit arrangement is responsive to the address signals to selectively designate a series of sensor cells at row and column intersections representative of the location of the oblique line component (e.g., an obliquely aligned line of cells). The sampling devices (26–32) access image data available at cells in said series of cells. The output device (34) then provides output signals from the series of cells (e.g., oblique line of cells) to provide output signals representative of the oblique top edge of image portion 39 rotated to an alignment not oblique to the rows and columns of the cells of array 16. This "rotation" can be accomplished inherently by reading out the image data from the obliquely aligned line of cells without providing any accompanying information as to the angular orientation (i.e., just reading out the image data sequentially and treating the data as representative of a horizontal line, for example). By repetitive action, data for additional oblique line portions can be read out to provide complete image data for image portion 39.

In particular implementations of the invention, location signals can be provided to coupling port 14 in a variety of formats. Such data can be provided by serial, parallel or combined formats or protocols. As noted, location signals can also call for a total image sequential readout in a traditional manner. Using random access logic, a user can call out varying levels of cell, line or area specificity. For example, if it is desired to read out all image data from lines 100 to line 150 of an array, the user can call for a readout beginning at line 100 and continuing on a line-by-line basis to line 150. Alternatively, the address line capabilities can be expanded to provide wider bus width to enable access to one particular sensor cell by control of readout circuits 22 and 24, rather than merely providing information at a line designation level. For example, for a 128×128 sensor cell array, a 7-bit wide address bus will enable random access of any line, a 14-bit wide address bus will enable random access to each single cell, and widths between 7 and 14 bits will enable access at levels between a cell and a line. Below 7-bit width, a 6-bit bus will permit access to any 2 adjacent lines, a 5-bit line will enable access to any 4 adjacent lines, etc. It will thus be appreciated that where, in a particular application, access is desired to single cells or to particular portions of image data, location signal, address signal and address bus specifications can be chosen to permit address bus and other capabilities to be provided on the most cost effective basis.

While there have been described the currently preferred embodiments of the invention, those skilled in the art will recognize that other and further modifications may be made without departing from the invention and it is intended to claim all modifications and variations as fall within the scope of the invention.

What is claimed is:

1. An oblique access image sensor array system, enabling readout on a single-coordinate sequential basis of image data for an oblique line component of a two-dimensional image area including an optically readable code, comprising:

a location signal source arranged to provide location signals representative of the location of said optically readable code within said image area;

a two-dimensional array of image sensor cells positioned in rows and columns and arranged to provide image data representative of said image area;

an address unit responsive to said location signals to provide two-coordinate address signals for row and column locations of sensor cells representative of image area components of said oblique line component, said oblique line component positioned obliquely to said rows and columns;

at least one readout circuit coupled to said array and responsive to said two-coordinate address signals to selectively designate an oblique series of said cells at row and column intersections representative of the location of said oblique line component;

at least one sampling device coupled to said array and arranged to access image data for said oblique line component as available at cells in said oblique series of cells; and an output circuit coupled to each said sampling device and arranged to provide single-coordinate output signals representative of image data read sequentially from said oblique series of cells, said output signals not including information as to the two-coordinate addresses of said cells from which the image data was accessed.

2. An oblique access image sensor array system as in claim 1, wherein said output device is an amplifier arranged to provide said output signals representative of said oblique line section as a series of image data values not accompanied by information as to the angular orientation of said oblique line component.

3. An oblique access image sensor array system as in claim 1, including horizontal and vertical readout circuits responsive to said address signals to respectively selectively designate rows and columns of said cells in order to designate said row and column intersections representative of the location of said oblique line component.

4. An oblique access image sensor array system as in claim 1, including a plurality of sampling devices, one coupled to each column of image sensor cells of said array.

5. An oblique access image sensor array system as in claim 1, wherein said array of image sensor cells comprises an array of photodiode devices and said readout circuit comprises a shift register type circuit.

6. An oblique access image sensor array system as in claim 1, wherein said location signal source is a bar code location system arranged to make available to said address unit location signals representative of the position of a bar code image within said image area.

7. An oblique access image sensor array system, enabling an oblique line component of a two-dimensional optically readable code to be read out sequentially as a horizontal line of image data, comprising:
   a location signal source arranged to provide location signals representative of the location of said optically readable code within said image area;
   a two-dimensional array of image sensor cells positioned in vertical rows and horizontal columns and arranged to provide image data representative of an image area containing an image of said optically readable code positioned obliquely to said rows and columns;
   an address unit responsive to said location signals to provide two-coordinate address signals for vertical and horizontal coordinates of the location within said image area of said oblique line component, said oblique line component positioned obliquely to said rows and columns;
   at least one readout circuit coupled to said array and responsive to said two-coordinate address signals to selectively designate an oblique series of said cells at vertical row and horizontal column intersections representative of the location of said oblique line component;
   at least one sampling device coupled to said array and arranged to access image data for said oblique line component as available at cells in said oblique series of cells at said vertical row and horizontal column intersections; and
   an output circuit coupled to each said sampling device and arranged to provide output signals representative of image data read sequentially from said oblique series of cells without accompanying two-coordinate address information and thereby representative of said oblique line component rotated to a horizontal alignment.

8. An oblique access image sensor array system as in claim 7, including two readout circuits responsive to said address signals to each selectively designate one of two intersecting lines of said cells, and wherein said at least one sampling device is arranged to access image data for said oblique line component which is available at cells at the intersections of said intersecting lines.

9. An oblique access image sensor array system as in claim 7, wherein said address unit is arranged to provide address signals representative of the location of said oblique line component, which comprises an oblique line component of predetermined length, inclination and curvature.

10. An oblique access image sensor array system as in claim 7, wherein said array of image sensor cells comprises an array of photodiode devices and said readout circuit comprises a shift register type circuit.

11. An oblique access image sensor array system as in claim 7, wherein said location signal source is a bar code location system arranged to provide location signals representative of the position of a bar code image within said image area.

12. An oblique access image sensor array system as in claim 7, wherein said address unit is arranged to provide address signals representative of the location of an oblique line component which is aligned with the top edge of said image portion containing the image of said optically readable code, said image portion being obliquely aligned within said image area covered by said array.

13. An oblique access image sensor array system as in claim 12, wherein said address unit is arranged to provide address signals representative of the locations of additional oblique line components in order to provide output signals representative of complete image data for said image portion containing the image of said optically readable code.

14. An oblique access method, for accessing image data representative of an optically readable code, comprising the steps of:
   (a) providing image data for an image area represented by an array of rows and columns of image sensor cells, said image area including an image portion containing an image of said code which is positioned obliquely to said rows and columns;
   (b) providing location signals representative of the location of said image portion within said image area;
   (c) providing, in response to said location signals, two-coordinate address signals for row and column locations of sensor cells representative of a first oblique line component of said image portion containing said code image, said first oblique line component positioned obliquely to said rows and columns;
   (d) utilizing said address signals to read image data out of an oblique series of said image sensor cells at row and column intersections representative of the location of said first oblique line component;
   (e) utilizing said step (d) image data to provide single-coordinate output signals representative of said image data provided sequentially without inclusion of information as to the original two-coordinate addresses of said image data; and
   (f) utilizing said output signals to decode said optically readable code.

15. An oblique access method as in claim 14, wherein said optically readable code is a 2-D bar code including rows of spaced bar elements extending at an oblique angle to said rows of sensor cells, and wherein in step (b) said location signals represent the location of a first oblique line component extending at an oblique angle so as to cross a plurality of said bar elements.

16. An oblique access method as in claim 14, additionally including the following step between steps (d) and (e):
   (x) repeating steps (c) and (d) for a plurality of additional oblique line components, each said additional oblique line component successively laterally spaced from said first oblique line component.

* * * * *